(12) United States Patent
Mazure et al.

(10) Patent No.: US 7,510,949 B2
(45) Date of Patent: Mar. 31, 2009

(54) METHODS FOR PRODUCING A MULTILAYER SEMICONDUCTOR STRUCTURE

(75) Inventors: Carlos Mazure, St. Nazaire les Eymes (FR); Bruno Ghyselen, Seyssinet (FR)

(73) Assignee: S.O.I.Tec Silicon on Insulator Technologies, Bernin (FR)

(*) Notice: Subject to any disclaimer, the term of this patent is extended or adjusted under 35 U.S.C. 154(b) by 289 days.

(21) Appl. No.: 11/106,135

(22) Filed: Apr. 13, 2005

(65) Prior Publication Data

US 2005/0191824 A1 Sep. 1, 2005

Related U.S. Application Data

(63) Continuation of application No. PCT/IB03/006397, filed on Dec. 5, 2003, and a continuation-in-part of application No. 10/615,259, filed on Jul. 9, 2003, now Pat. No. 6,953,736, and a continuation-in-part of application No. 10/614,327, filed on Jul. 8, 2003, now Pat. No. 7,018,910.

(30) Foreign Application Priority Data

| Jul. 9, 2002 | (FR) | .................................. 02 08600 |
| Jul. 9, 2002 | (FR) | .................................. 02 08602 |
| Dec. 6, 2002 | (FR) | .................................. 02 15499 |

(51) Int. Cl.
*H01L 21/30* (2006.01)
*H01L 21/46* (2006.01)

(52) U.S. Cl. .............................. 438/458; 257/E21.568

(58) Field of Classification Search ................ 438/458; 257/E21.568
See application file for complete search history.

(56) References Cited

U.S. PATENT DOCUMENTS 5,882,987 A    3/1999   Srikishnan .................. 438/458

6,194,245 B1 *  2/2001  Tayanaka ..................... 438/57
6,251,754 B1 *  6/2001  Ohshima et al. ............. 438/506

(Continued)

FOREIGN PATENT DOCUMENTS

| EP | 1 050 901    | 11/2000 |
| WO | WO 00/15885  | 3/2000  |
| WO | WO 02/15244  | 2/2002  |
| WO | WO 02/071491 | 9/2002  |
| WO | WO03/017358  | 2/2003  |
| WO | WO 2004/006327 | 1/2004 |

OTHER PUBLICATIONS

Bauer, M. et al., 2000, "Relaxed SiGe Buffers with Thicknesses Below 0.1 μm", Elsevier Science S.A., pp. 152-156.

(Continued)

*Primary Examiner*—Zandra Smith
*Assistant Examiner*—Daniel Luke
(74) *Attorney, Agent, or Firm*—Winston & Strawn LLP

(57) ABSTRACT

Methods for producing a multilayer semiconductor structure are described. In an embodiment, the method includes providing a support substrate made of a first semiconductor material having a first lattice parameter, and depositing a layer of a second semiconductor material having a second lattice parameter, substantially different than the first, onto the support substrate to form an intermediate structure having an interface therebetween, the depositing being conducted such that most of the defects are confined to an adaptation layer located in a region adjacent to the interface. The method also includes creating a zone of weakness in the intermediate structure, bonding the second semiconductor material layer to a target substrate, detaching the support substrate at the zone to obtain a multilayer semiconductor structure having an exposed surface where detached, and fully removing the adaptation layer to obtain a relaxed thin layer of the second semiconductor material having a high quality surface.

21 Claims, 1 Drawing Sheet

U.S. PATENT DOCUMENTS

| | | | | |
|---|---|---|---|---|
| 6,323,108 | B1 * | 11/2001 | Kub et al. | 438/458 |
| 6,382,292 | B1 * | 5/2002 | Ohmi et al. | 156/584 |
| 6,537,370 | B1 * | 3/2003 | Hernandez et al. | 117/88 |
| 6,562,703 | B1 * | 5/2003 | Maa et al. | 438/518 |
| 2002/0061660 | A1 * | 5/2002 | Ito | 438/795 |
| 2002/0072130 | A1 * | 6/2002 | Cheng et al. | 438/10 |
| 2002/0168864 | A1 * | 11/2002 | Cheng et al. | 438/725 |

OTHER PUBLICATIONS

Hollander, B. et al., 2001, "Strain Relaxation of Pseudomorphic $Si_{1-x}Ge_x/Si(100)$ Heterostruct. after Hydrogen or Helium Ion Implantation for Virtual Substrate Fabrication", Nuclear Instrument and Methods in Physics Research, pp. 357-367.

Lyutovich, K. et al., 2002, "Thin SiGe Buffers with High Ge Content for n-MOSFETs", Elsevier Science B.V., pp. 341-345.

Taraschi, G. et al., 2002, "Relaxed SiGe-on-Insulator Fabricated Via Wafer Bonding and Etch Back", J. Vac. Sci. Technol., pp. 725-727.

Delhougne, R. et al., 2003, "Development of a New Type of SiGe Thin Strain Relaxed Buffer Based on the Incorporation of Carbon-Containing Layer", SiGe Technology and Device Meeting (ISTDM), Nagoya, Japan.

* cited by examiner

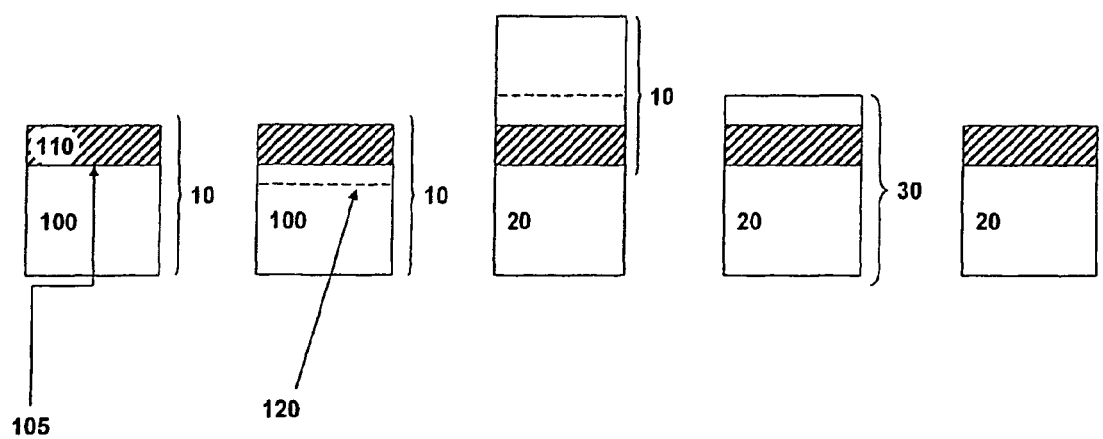

METHODS FOR PRODUCING A MULTILAYER SEMICONDUCTOR STRUCTURE

CROSS-REFERENCE TO RELATED APPLICATIONS

This application is a continuation of International application PCT/IB03/006397 filed on Dec. 5, 2003, and is a continuation-in-part of U.S. patent application Ser. No. 10/614,327, filed on Jul. 8, 2003 now U.S. Pat. No. 7,018,910, and is a continuation-in-part of U.S. patent application Ser. No. 10/615,259 filed on Jul. 9, 2003 now U.S. Pat. No. 6,953,736, the entire contents of which are expressly incorporated herein by reference thereto.

BACKGROUND ART

The present invention generally relates to a manufacturing process for producing a multilayer semiconductor structure. The multilayer structure includes a substrate made of a first semiconductor material and a superficial thin layer made of a second semiconductor material wherein the two semiconductor materials have substantially different lattice parameters.

It is known to produce semiconductor structures that include a substrate made of a material such as silicon, and a superficial thin layer made of a material such as silicon-germanium (SiGe), or germanium (Ge). International Application WO2004/006327 relates to a process for producing a structure having a thin layer of semiconductor material from a wafer that includes a lattice parameter adaptation layer with an upper semiconductor layer having a first lattice parameter. This process includes growing a film on the upper layer of the adaptation layer, wherein the film is made of semiconductor material having a second nominal lattice parameter that is substantially different than the first lattice parameter. The film has a minimal thickness sufficient to strain the first lattice parameter of the upper layer of the underlying adaptation layer. The process also includes growing a relaxed layer on the film, the relaxed layer made of semiconductor material having a nominal lattice parameter substantially identical to the first lattice parameter, and removing at least a part of the wafer on the side of the adaptation layer relative to the relaxed layer. The removal process includes forming a zone of weakness on a side of the adaptation layer relative to the relaxed layer, and supplying energy to the zone of weakness to detach a structure from the wafer that includes the relaxed layer.

The described process uses a layer transfer technique (for example, of the SMART-CUT® type process or the ELTRAN® type process) to produce the desired wafer. The starting point of such a process is a wafer with a lattice parameter adaptation layer corresponding to a region of the wafer that has a surface layer of substantially relaxed material, without a large number of structural defects such as dislocations. A relaxed layer is understood to mean any semiconductor layer which has a non-strained crystallographic structure, that is, one which has a lattice parameter substantially identical to the nominal lattice parameter of the material making up the layer. Conversely, a strained layer is a semiconductor material layer wherein the crystallographic structure is strained by expansion or by compression during crystalline growth, such as epitaxy, which causes at least a lattice parameter to be substantially different than the nominal lattice parameter of the material.

The process described in International Application WO2004/006327 is an advantageous solution for fabricating multilayer structures. However, there is a need for obtaining improved results.

SUMMARY OF THE INVENTION

Presented are methods for producing a beneficial multilayer semiconductor structure. In an embodiment, the method includes providing a support substrate made of a first semiconductor material having a first lattice parameter, and depositing a layer of a second semiconductor material having a second lattice parameter that is substantially different than the first lattice parameter onto the support substrate. In this manner, an intermediate structure is formed that has an interface between the first and second semiconductor materials, and the depositing is conducted such that most of the defects in the deposited layer are confined to an adaptation layer located in a region adjacent to the interface. The method also includes creating a zone of weakness in the intermediate structure, bonding the second semiconductor material layer to a target substrate, detaching the support substrate at the zone of weakness to obtain a multilayer semiconductor structure having an exposed surface where detached, and treating the exposed surface to assure that the adaptation layer is fully removed in order to obtain a relaxed thin layer of the second semiconductor material having a high quality surface.

In an advantageous implementation of the method according to the invention, the second semiconductor material layer is deposited by epitaxy. In particular, the second semiconductor material layer is epitaxially grown by stabilizing the support substrate using a first preset stabilizing temperature, and then a second semiconductor material base layer is chemically deposited on the support substrate that has a preset thickness less than a final desired thickness, wherein the chemical deposit occurs in a steam phase at the first preset stabilizing temperature. The temperature is then increased from the first preset temperature to a second preset temperature, and additional second semiconductor material is chemically deposited in the steam phase at the second preset temperature until a final desired thickness is obtained. In an implementation, the first preset temperature is between about 400° C. to about 500° C., and the second preset temperature is between about 750° C. to about 850° C. Advantageously, the first preset temperature is between about 430° C. to about 460° C., and the second preset temperature is between about 800° C. to about 850° C. In an advantageous variant, the methods also includes producing the second semiconductor material layer by creating a strained layer and by relaxing the layer.

An advantageous embodiment further includes forming the zone of weakness by implanting atomic species. In an implementation, the zone of weakness is formed by co-implanting two different atomic species. The atomic species are advantageously implanted such that the zone of weakness is located within the support substrate so that a portion of the support substrate is transferred after detachment, and the treating step includes removing both the adaptation layer and the portion of the support substrate that was transferred. In a beneficial variant, the atomic species are implanted such that the zone of weakness is located within the adaptation layer and the treating step includes removing that portion of the adaptation layer that was transferred. Alternately, the atomic species may be implanted such that the zone of weakness is located within the deposited layer and the treating step includes assuring removal of that portion of the adaptation layer that was transferred.

In a beneficial aspect, the method also includes, prior to the bonding step, providing an electrically insulating layer between the intermediate structure and the target substrate. The electrically insulating layer may advantageously be formed on at least one of the surface of the deposited layer of the intermediate structure, or on a surface of the target substrate. In addition, the electrically insulating layer may be made of an oxide. In a beneficial embodiment, at least one of the target substrate and the support substrate is made of silicon. Advantageously, the second semiconductor material layer is made of at least one of SiGe or Ge.

In another advantageous embodiment, the method further includes forming the second semiconductor material layer to include a stop layer capable of resisting a chemical attack during the surface treatment. Another beneficial implementation includes forming the second semiconductor material layer to include three levels of layers corresponding to a lattice parameter adaptation layer, a stop layer, and an active layer of the multilayer semiconductor structure. The lattice parameter adaptation layer, the stop layer, and the active layer are made of at least one of a first combination comprising Ge, SiGe (50/50) and SiGe or Ge, or a second combination comprising SiGe, strained Si and SiGe or Ge.

Another beneficial aspect according to the invention further includes forming the second semiconductor material layer to include a lattice parameter adaptation layer and an active layer. The lattice parameter adaptation layer and the active layer are made of at least one of a first combination comprising Ge and SiGe (50/50), or a second combination comprising SiGe and strained Si.

BRIEF DESCRIPTION OF THE DRAWING FIGURES

Other aspects, purposes and advantages of the invention will become clear after reading the following detailed description with reference to the attached drawings, in which:

FIGS. 1a to 1e are simplified diagrams of a semiconductor substrate to illustrate an embodiment of the process according to the invention.

DETAILED DESCRIPTION OF THE PREFERRED EMBODIMENTS

FIG. 1a shows a support substrate 100 upon which a layer 110 (shown in hatched lines) has been deposited. The support substrate 100 is made of a semiconductor material having a first lattice parameter. For example, it can be made of silicon. The layer 110 is made of a material having a second lattice parameter different than the first lattice parameter mentioned above. For example, the layer 110 can be made of SiGe or of Ge.

The layer 110 is deposited by a technique that permits the deposit of a desired thickness of a material, and the lattice parameter of the layer 110 is substantially different than the lattice parameter of the support substrate. The layer 110 includes a superficial thin layer which is virtually free from dislocation defects.

U.S. Pat. No. 6,537,370 describes a process, for example, that permits SiGe or Ge to be deposited on silicon. Such a deposit process can, for example, be accomplished according to a first mode in which monocrystalline Ge is deposited on a support substrate of monocrystalline silicon. A temperature stabilization step is conducted on the substrate of monocrystalline silicon at a first preset stabilized temperature of about 400° C. to about 500° C., and preferably of about 430° C. to about 460° C. Then chemical deposition of Ge in the steam phase (CVD) at the first preset temperature is conducted until a base layer of Ge is obtained on the support substrate having a preset thickness of less than a final desired thickness. Next, the temperature of chemical deposition in the steam phase for Ge is increased from the first preset temperature to a second preset temperature ranging from about 750° C. to about 850° C., and preferably from about 800° C. to about 850° C. Lastly, chemical deposition is continued in the steam phase of Ge at the second preset temperature until a final desired thickness is obtained for the layer of monocrystalline Ge. Such a deposit process can also be carried out according to variants, such as those disclosed in U.S. Pat. No. 6,537,370.

Other methods for obtaining a thin layer of relaxed SiGe or relaxed Ge directly on a support substrate, which can be made of silicon, are also feasible. Reference could be made to the publication: "Strain relaxation of pseudomorphic Si1-xGex/Si (100) heterostructures after hydrogen or helium ion implantation for virtual substrate fabrication", B. Holländer et al, Nuclear Instrument and Methods in Physics Research B175-177 (2001) 357-367, which is incorporated by reference herein. In such a process, the layer 110 is produced by making a strained layer, and then by relaxing this layer.

Thin layers of relaxed SiGe can also be obtained by techniques disclosed in the following three documents, which are all incorporated by reference herein. These references disclose methods for obtaining such layers which can be used with the present method. The first is: "Development of a new type of SiGe thin strained relaxed buffer based on the incorporation of carbon containing layer", presented in the first SiGe Technology and Device Meeting (ISTDM, Nagoya, Japan, Jan. 15-17, 2003). Another reference is: "Thin SiGe Buffers with High Ge content for n-Mosfets" (Lyutovich et al. Material Science & Engineering, B89 (2002), pages 341-345). The third reference is: "Relaxed SiGe buffers with thickness below 0.1 μm" (Bauer et al., Thin Solid Films 369 (2000), pages 152-156).

According to the present process, in all cases a layer 110 is formed that has a superficial thin layer or active layer suitable for producing a desired structure, and is created on the support substrate 100. As shown in FIG. 1a, an intermediate wafer structure 10 includes a layer 110 made of SiGe (with the desired Si/Ge ratio) or made of Ge on the support substrate 100. The free surface of layer 100 can be polished to permit or encourage bonding of the intermediate wafer 10, which is the next step in the process. The surface roughness of the intermediate wafer 10 should be no more than a few angstroms rms for such bonding.

FIG. 1a also shows an interface 105 that is defined between the layer 110 and the support substrate 100. By using the deposit process described above, the dislocation defects have been confined to a region of the layer 110 that is adjacent to the interface 105. In other words, the majority of the dislocation defects are located in the region adjacent to the interface 105. The rest of the layer 10 is not fully exempt from defects, but the concentration of defects in these other regions is acceptable for microelectronic applications. The region of the layer 110 in which the dislocation defects are confined is called a lattice parameter adaptation layer, which is located between the support substrate 100 made of silicon and the superficial thin layer region of the layer 110. The thin layer of the wafer 10 is made of Ge or made of relaxed SiGe. In addition, this layer of Ge or relaxed SiGe has a desired thickness resulting from the deposit made at the beginning of the process. The desired thickness can be in particular on the order of about 0.5 to about 1 micron.

FIG. 1b shows that a zone of weakness 120 has been created within the thickness of the wafer 10. The zone of weakness can be produced by implanting atomic species through the layer 110. The implanted species may include one or several atomic or molecular species, such as hydrogen or helium ions or molecules. The implanting process may include co-implantation of different species, such as hydrogen and helium. The term "implantation" covers implanting a single type of species as well as such a co-implantation of at least two species.

When the zone of weakness is made by using implantation, the implantation parameters can be defined so that the resulting zone of weakness is located in the support substrate 100, as illustrated in FIG. 1b. It is also possible to define these parameters so that the zone of weakness is located within the layer 110 (preferably in the region of the layer 110 that is adjacent to the interface 105). But the zone of weakness could also have been made by creating a porous region in the support substrate 100, before depositing the layer 110.

FIG. 1c illustrates the wafer including the zone of weakness being bonded to a target substrate 20. The target substrate 20 can be made of silicon. The face of the wafer 10 that is bonded to the target substrate corresponds to the relaxed surface of the layer 110. The surfaces that are to be bonded have been cleaned prior to being placed in contact, and a bonding layer has been optionally inserted in between these surfaces. An electrical insulating layer, for example an oxide, can also be inserted between the intermediate wafer structure 10 and the target substrate 20. The oxide can originate from oxidation of the surface of the target substrate 20. It could also originate from oxidation of the surface of the layer 110, if it is made of SiGe. If the layer 110 is made of Ge or SiGe, then it is also possible to associate an oxide layer to it prior to bonding, by oxide deposition. The wafer and/or the target substrate can therefore include an insulating layer, prior to bonding. If required, the surface of one or both of the substrates that are to be bonded can be treated, so that the surface roughness is reduced to favorable values for bonding (i.e. not more than a few angstroms rms). Such a surface treatment can be a polishing step. After bonding, it is possible to proceed with a classic thermal treatment to strengthen the bonding interface.

FIG. 1d illustrates the resulting multilayer structure 30 after the support substrate has been detached at the level of the zone of weakness interface, by supplying thermal and/or mechanical energy. The multilayer structure 30 includes the target substrate 20, the layer 110, and optionally a residual portion of the support substrate 100. In this structure, the layer 110 includes a lattice parameter adaptation layer (the part of the layer 110 that is adjacent to the residual portion of the support substrate 100), and a relaxed layer of desired thickness.

In the case where the zone of weakness was created by implantation in the thickness of the "lattice parameter adaptation layer" of layer 110, the resulting structure 30 does not include a residual portion of the support substrate. Instead, a part of the lattice parameter adaptation layer is separated from this structure 30 during the detachment step. In this case, as shown in FIG. 1e, the surface of the resulting structure is treated to improve the state of the surface of the layer 110. Such surface treatment can include polishing, as well as other types of treatment.

It is also possible to perform the implantation so as to obtain the zone of weakness in the relaxed portion of the layer 110. In this case, the transferred layer does not include faults such as dislocations (or only contains very few), and thus the resulting structure can present a surface layer after detachment (which results from the relaxed part of layer 110) which does not need any additional treatment.

In the case where the zone of weakness is located within the thickness of the support substrate 100 (by implantation or by creation of a porous region), the next step is selective attack of the residual portion of this support substrate. The selective attack can take the form of selective chemical etching, which attacks only the material of the support substrate. Such etching can be done by a wet method (choice of an adapted etching solution), or by a dry method (selective etching via energy plasma, or pulverization, for example). Such etching can be preceded by polishing. At the beginning of the selective attack, the free surface of the layer 110 is treated to remove the lattice parameter adaptation layer, which corresponds to the part of the layer 110 that contains most of the dislocation defects.

Described above are two main variants for implementing the invention (creation of an zone of weakness in the support substrate, and in the layer 110, respectively). In these two cases, the active layer of the final structure corresponds to the relaxed part of the layer 110.

In accordance with a third variant, the layer 110 is constructed of different levels (or strata). Such a layer 110 can be created by depositing a first level, for example, by using a technique such as that disclosed by U.S. Pat. No. 6,537,370, or as described in the B. Holländer et al. reference mentioned above, or generally by any other known technique for producing a relaxed thin layer. Then, a second level is deposited constituting a stop layer for use in preventing a further chemical attack. Lastly, a third level is deposited corresponding to a relaxed layer to make the active layer of the final structure. This deposition is done to achieve a desired thickness for the active layer.

The first level corresponds to the lattice parameter adaptation layer. It can be made of SiGe or Ge. The second level at the same time must have good selectivity relative to the third level, vis-à-vis chemical attack (in this respect, different materials must be employed for levels 2 and 3). In addition, the lattice parameter of the second level must not be too significantly different than that of the two levels that surround it (consequently, the materials of levels 1, 2 and 3 must not be too different). For example, the following combinations could be used:

| Material level 1 | Material level 2 | Material level 3 |
|---|---|---|
| Ge | SiGe (50/50) | SiGe or Ge |
| SiGe | strained Si | SiGe or Ge |

It is preferable for the layers of level 1 and level 3 to be made from materials having the same nature, so that the level 2 layer, inserted between these two layers, has homogeneous constraints on its two faces.

In this case, the following materials will preferably be used:

| Material level 1 | Material level 2 | Material level 3 |
|---|---|---|
| Ge | SiGe (50/50) | Ge |
| SiGe | strained Si | SiGe |

In this third variant, the same steps are followed for creating a zone of weakness, for bonding, and for detachment of the structure 30. The zone of weakness can therefore again be located in the layer 110. In this case, the zone of weakness is preferably located in the thickness of the first level (in which it was created by implantation).

To obtain the final structure two selective attacks are conducted. The first selective attack eliminates the residue of the first level. In particular, a chemical attack could be used which validates having a stop layer level. A second chemical attack can then be used to eliminate the stop layer.

It is also possible to fabricate the layer 110 with only two levels. In this case, the first level is the same as described above, and the second level resembles the levels 2 and 3 mentioned above. For example, the second level can be made of strained silicon, whereas the first level is made of SiGe or Ge. The second level thus makes up the active layer of the final structure, while the first level is still a lattice parameter adaptation layer. In this case, the following materials could be used (this table, and the preceding tables, are provided herein as non-limiting examples):

| Material level 1 | Material level 2 |
|---|---|
| Ge | SiGe (50/50) |
| SiGe | strained Si |

In all cases, conventional surface treatment measures can be followed after the structure shown in FIG. 1*e* has been produced. The present process thus enables multilayer semiconductor structures to be produced that include, for example, a layer of Ge or SiGe on a silicon substrate.

It should be noted that the adaptation layer portion of the layer 110 does not include a concentration gradient within its thickness (that is, a gradient of the concentration of Germanium, if the adaptation layer is between a Si support substrate and a relaxed layer of Ge, or of SiGe with a given concentration of Ge). Conventional adaptation layers often present such a concentration gradient, which corresponds to a gradient of the lattice parameter in the adaptation layer. But such adaptation layers with a concentration gradient are necessarily relatively thick (the more important the difference in lattice parameter on both sides of the adaptation layer, the thicker the adaptation layer). Published International Application PCT/US01/41680 discloses an example of such a traditional adaptation layer with a concentration gradient. In contrast, the adaptation layer resulting from using the present process can be very thin.

It is also noted that the defects (e.g. dislocations) are confined to the region of the layer 110 which is adjacent to the interface 105 with the support substrate 100. This specific aspect of the present process is advantageous (as compared to known techniques, such as that disclosed in published International Application PCT/US01/41680). An advantage associated with this aspect is the fact that such a thin adaptation layer makes it possible to create the zone of weakness by implantation within the support substrate 100, because the implanted species can traverse the adaptation layer. Such operation permits, after detachment and removal of the remaining material (Si or other) of the support substrate 100, to obtain a final structure with a very high quality surface, without needing to use burdensome treatments to treat a resulting rough surface that normally occurs after detachment at a zone of weakness located within the adaptation layer itself. This would be the case with an adaptation layer that has a gradient, because such layers are too thick to be traversed by the implanted species.

It is also be noted that the multilayer structures obtained by the present methods have reduced amounts of dislocation defects, even in an embedded region. In addition, the resulting structures can include supplementary layers, for example strained silicon, grown by epitaxy on the layer of SiGe or Ge. In the case where the layer of level 2 is made of strained Si, it can be advantageous to make only a single selective attack to generate a final structure consisting of a bi-layer of strained silicon and SiGe on a silicon substrate. In this case, the final structure includes the stop layer. Finally, it is also possible to deposit a layer of strained silicon on the level layer 3 prior to bonding this structure onto the target substrate, resulting in a final structure that includes a layer of strained silicon on a silicon substrate.

What is claimed is:

1. A method for producing a multilayer semiconductor structure, which comprises:

providing a support substrate made of a first semiconductor material having a first lattice parameter;

depositing a layer of a second semiconductor material having a second lattice parameter that is substantially different than the first lattice parameter onto the support substrate to form an intermediate structure having an interface between the first and second semiconductor materials, the depositing being conducted such that most of the defects in the deposited layer are confined to an adaptation layer of the second semiconductor material layer that is located in a region adjacent to the interface;

creating a zone of weakness in the intermediate structure;

bonding the second semiconductor material layer to a target substrate;

detaching the support substrate at the zone of weakness to obtain a multilayer semiconductor structure having an exposed surface where detached; and treating the exposed surface to assure that the adaptation layer is fully removed in order to obtain a relaxed thin layer of the second semiconductor material having a high quality surface.

2. The method of claim 1, wherein the second semiconductor material layer is deposited by epitaxy and the relaxed thin layer has a thickness on the order of about 0.5 to about 1 micron.

3. The method of claim 2, which further comprises epitaxially growing the second semiconductor material layer by:

stabilizing the support substrate using a first preset stabilizing temperature;

chemically depositing a second semiconductor material base layer on the support substrate that has a preset thickness less than a final desired thickness, the deposit occurring in a steam phase at the first preset stabilizing temperature;

increasing the temperature from the first preset temperature to a second preset temperature; and chemically depositing additional second semiconductor material in the steam phase at the second preset temperature until a final desired thickness is obtained.

4. The method of claim 3, wherein the first preset temperature is between about 400° C. to about 500° C., and the second preset temperature is between about 750° C. to about 850° C.

5. The method of claim 4, wherein the first preset temperature is between about 430° C. to about 460° C., and the second preset temperature is between about 800° C. to about 850° C.

6. The method of claim 1, which further comprises producing the second semiconductor material layer by creating a strained layer and by relaxing the layer.

7. The method of claim 1, which further comprises forming the zone of weakness by implanting atomic species.

8. The method of claim 7, which further comprises co-implanting two different atomic species.

9. The method of claim 7, which further comprises implanting the atomic species such that the zone of weakness is located within the support substrate so that a portion of the support substrate is transferred after detachment, and the treating step includes removing both the adaptation layer and the portion of the support substrate that was transferred.

10. The method of claim 7, which further comprises implanting the atomic species such that the zone of weakness is located within the adaptation layer and the treating step includes removing that portion of the adaptation layer that was transferred.

11. The method of claim 7, which further comprises implanting the atomic species such that the zone of weakness is located within the deposited layer and the treating step includes assuring removal of that portion of the adaptation layer that was transferred.

12. The method of claim 1, which further comprises, prior to the bonding step, providing an electrically insulating layer between the intermediate structure and the target substrate.

13. The method of claim 12, which further comprises forming the electrically insulating layer on at least one of the surface of the deposited layer of the intermediate structure, or on a surface of the target substrate.

14. The method of claim 12, wherein the electrically insulating layer is made of an oxide.

15. The method of claim 1, wherein at least one of the target substrate and the support substrate is made of silicon.

16. The method of claim 1, wherein the second semiconductor material layer is made of at least one of SiGe or Ge.

17. The method of claim 1, which further comprises forming the second semiconductor material layer to include a stop layer capable of resisting a chemical attack during the surface treatment.

18. The method of claim 1, which further comprises forming the second semiconductor material layer to include three levels of layers corresponding to a lattice parameter adaptation layer, a stop layer, and an active layer of the multilayer semiconductor structure.

19. The method of claim 18, wherein the lattice parameter adaptation layer, the stop layer, and the active layer are made of at least one of a first combination comprising Ge, SiGe (50/50) and SiGe or Ge, or a second combination comprising SiGe, strained Si and SiGe or Ge.

20. The method of claim 1, which further comprises forming the second semiconductor material layer to include a lattice parameter adaptation layer and an active layer.

21. The method of claim 20 wherein the lattice parameter adaptation layer and the active layer are made of at least one of a first combination comprising Ge and SiGe (50/50), or a second combination comprising SiGe and strained Si.

* * * * *